(12) United States Patent
Kang et al.

(10) Patent No.: US 6,868,003 B2
(45) Date of Patent: Mar. 15, 2005

(54) MAGNETIC RANDOM ACCESS MEMORY

(75) Inventors: Hee Bok Kang, Daejeon-shi (KR);
Geun Il Lee, Kyoungki-do (KR); Jung Hwan Kim, Seoul (KR); Hun Woo Kye, Kyoungki-do (KR); Duck Ju Kim, Jaeju-shi (KR); Je Hoon Park, Kyoungki-do (KR)

(73) Assignee: Hynix Semiconductor Inc., Ichon-shi (KR)

(*) Notice: Subject to any disclaimer, the term of this patent is extended or adjusted under 35 U.S.C. 154(b) by 184 days.

(21) Appl. No.: 10/277,735

(22) Filed: Oct. 23, 2002

(65) Prior Publication Data

US 2003/0107914 A1 Jun. 12, 2003

(30) Foreign Application Priority Data

Dec. 7, 2001 (KR) .................................... 2001-77169
Dec. 7, 2001 (KR) .................................... 2001-77170

(51) Int. Cl.[7] ................................................ G11C 7/00
(52) U.S. Cl. ...................................... 365/171; 365/158
(58) Field of Search .................................. 365/171, 158, 365/175

(56) References Cited

U.S. PATENT DOCUMENTS 5,793,697 A * 8/1998 Scheuerlein ............ 365/230.07

* cited by examiner

*Primary Examiner*—Vu A. Le
(74) *Attorney, Agent, or Firm*—Pillsbury Winthrop LLP

(57) ABSTRACT

The present invention discloses a magnetic random access memory comprising MRAM cell groups connected in series in forms of an NAND. The MRAM cell groups comprise magnetic tunnel junctions between word lines and P-N diodes, and memory cells for reading and writing data. In the present invention, the cell size can be reduced by comprising MRAM cell arrays wherein one or more MRAM cells are connected in series in forms of an NAND.

15 Claims, 12 Drawing Sheets

MAGNETIC RANDOM ACCESS MEMORY

BACKGROUND OF THE INVENTION

1. Field of the Invention

The present invention generally relates to a magnetic random access memory (hereinafter, referred to as "MRAM"), and in particular, to an MRAM comprising a magnetic tunnel junction (hereinafter, referred to as "MTJ") between a word line and a P-N diode, the MRAM wherein memory cells for storing two or more data are connected in series to each other in a form of an NAND, and data is read/written therein.

2. Description of the Prior Art

Most of companies for fabricating semiconductor memory are developing an MRAM using ferromagnetic materials, which is one of the next generation memory devices. An MRAM is a memory form for storing magnetic polarization in the thin film of magnetic materials. In the MRAM, read/write operations are performed by changing magnetic polarization according to the magnetic field generated by combining currents in a bit line and a word line.

The above MRAM is comprised of various kinds of cells such as a giant magneto resistance (hereinafter, referred to as "GMR") or an MTJ. In other words, the MRAM is a memory device embodied by using GMR or spin polarization magnetic permeating phenomena. Those phenomena are generated due to the influence of spin on transmission of electrons. First, the MRAM using a GMR is embodied by using a phenomenon wherein resistance is more differentiated when spin directions are anti-parallel better than when parallel in two magnetic layers having an insulating layer therebetween. Second, the MRAM using spin polarization magnetic permeation is embodied by using a phenomenon wherein current is better permeated when spin directions are parallel than when anti-parallel in two magnetic layers having an layer therebetween.

The conventional MRAM has a structure of 1T+1MTJ comprising a switching device T and an MTJ, as shown in FIG. 1.

Here, FIGS. 2a and 2b represents the structure of the MTJ.

In detail, an MTJ includes a free ferromagnetic layer 2, a tunnel junction layer 3 and a fixed ferromagnetic layer 4. The free ferromagnetic layer 2 is formed on the top while the fixed ferromagnetic layer 4 is on the bottom. Here, a free ferromagnetic layer 2 and a fixed ferromagnetic layer 4 consists of NiFeCo/CoFe, and a tunnel junction layer 3 of $Al_2O_3$. The thickness of a free ferromagnetic layer 2 is different from that of a fixed ferromagnetic layer 4. According to this difference of thickness, magnetic polarization of a fixed ferromagnetic layer 4 is changed just in a strong magnetic field, while that of a free ferromagnetic layer 2 is changed even in a weak magnetic field.

FIG. 2a is a diagram illustrating an example of parallel magnetization orientation in a free ferromagnetic layer 2 and a fixed ferromagnetic layer 4. If the magnetization orientation is parallel, a sensing current increases. On the contrary FIG. 2b is a diagram illustrating an example of anti-parallel magnetization orientation in a free ferromagnetic layer 2 and a fixed ferromagnetic layer 4. In this case, a sensing current decreases. Here, magnetization orientation of a free ferromagnetic layer 2 is changed by an external magnetic field. An MRAM cell stores logic values of "0" or "1" according to this magnetization orientation of a free ferromagnetic layer 2. As a result, during a write operation, while magnetic polarization of a fixed ferromagnetic layer 4 is maintained, that of a free ferromagnetic layer 2 is changed.

As shown in FIG. 1, an MRAM cell includes a plurality of word lines WL1~WL4, a plurality of bit lines BL1 and BL2, a cell 1 selected by those lines, and sense amplifiers SA1 and SA2 connected to a plurality of bit lines BL1 and BL2.

In the conventional MRAM cell having this structure, a cell 1 is selected by a word line WL4 selecting signal. When a predetermined voltage is applied to an MTJ through a switching device T, a sensing current flowing into a bit line BL2 is changed according to polarity of an MTJ. As a result, data can be read by amplifying this sensing current according to a sense amplifier SA2.

However, the above-described conventional MRAM has a complicated structure of a cell because a cell includes 1T+1MTJ. In other words, a process of embodying an MRAM is difficult because a cell has a transistor T and an MTJ. In addition, the conventional MRAM has a problem in a cell size.

SUMMARY OF THE INVENTION

Accordingly, in order to overcome the above-described problem, it is an object of the present invention to store two or more data by combining an MTJ between a word line and P-N diode, thereby embodying a magnetoic RAM having a simple structure and reducing their cell size.

It is another object of the present invention to embody a cell array wherein one or more memory cells are connected between a bit line and a cell plate in a form of an NAND, thereby embodying an MRAM having a simple structure.

TO accomplish the object of the present invention, there is provided a magnetic random access memory comprising: a P-N diode having an N+ region doped on a semiconductor substrate and a P-type impurity region doped on the line of the N+ region; a barrier conductive layer deposited on the top portion of the P-type impurity region; and an MRAM cell having an MTJ between the barrier conductive layer and a word line, wherein data is read/written at the MRAM cell by regulating a current flowing through the MTJ according to voltage applied to the word line.

According to one aspect of the present invention, a magnetic random access memory is comprised of a plurality of word lines, a plurality of bit lines and a plurality of MRAM cells groups; wherein the MRAM cell groups are located at one side of a bit line, and includes a plurality of MRAM cells having each gate connected to different word lines, respectively; and wherein the plurality of MRAM cells have each drain and source connected in series in a form of an NAND, the one terminal of the MRAM cell group is connected to one of the bit lines, and the other terminal is connected through a diode to a cell plate.

BRIEF DESCRIPTION OF THE DRAWINGS

The present invention will be explained in terms of exemplary embodiments described in detail with reference to the accompanying drawings, which are given only by way of illustration and thus are not limitative of the present invention, wherein.

DESCRIPTION OF THE PREFERRED EMBODIMENTS

Figure 1:
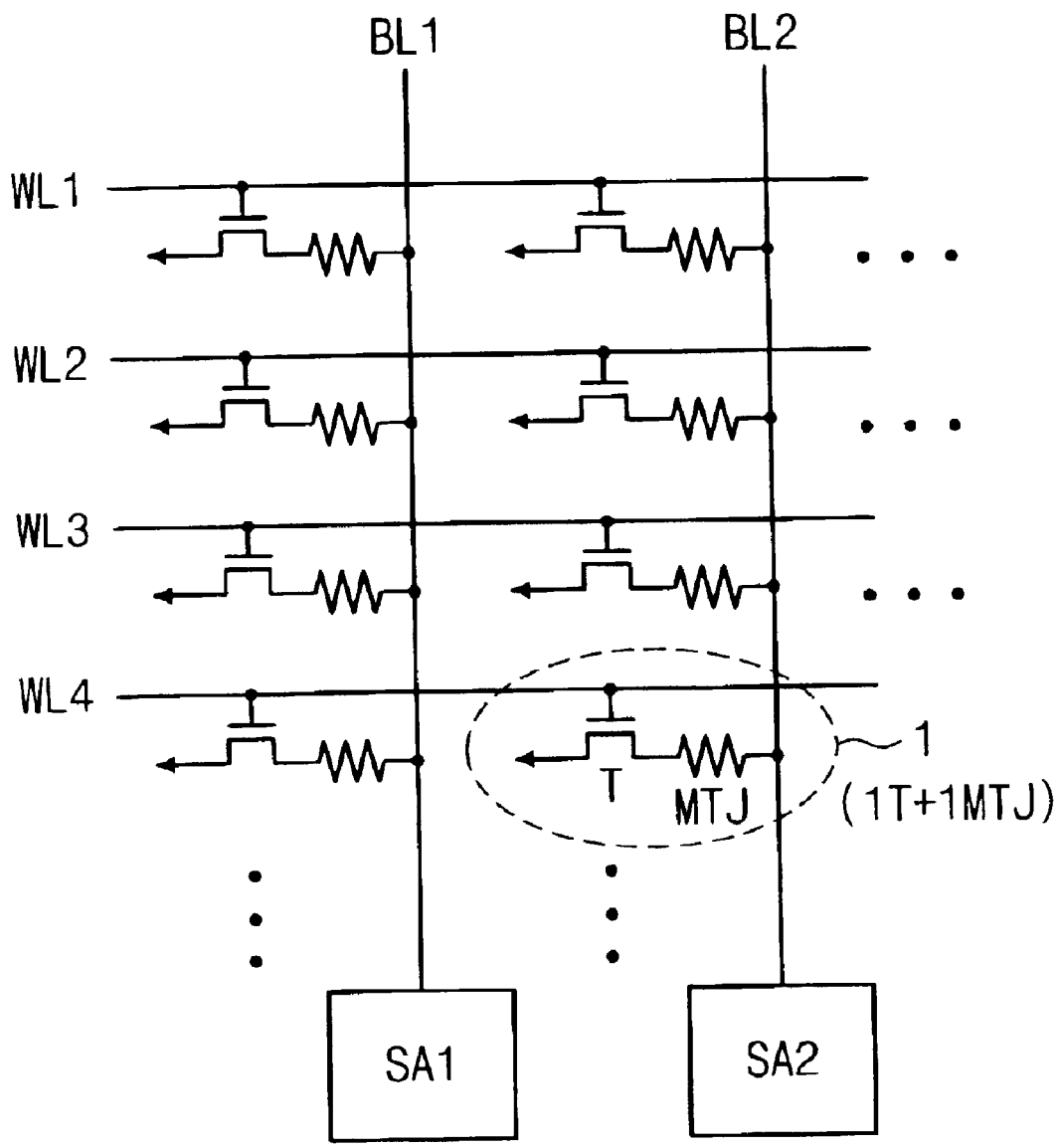
FIG. 1 illustrates a conventional MRAM cell array.
Figure 2A:
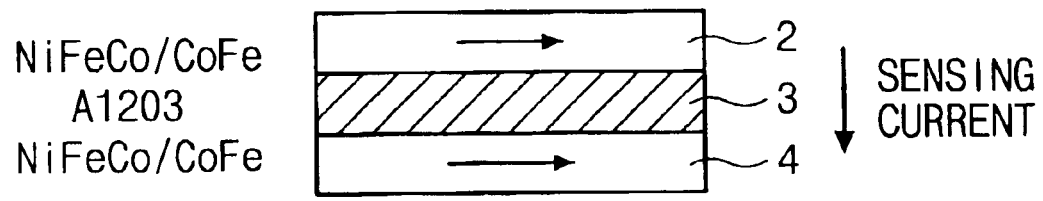
FIGS. 2a and 2b illustrate cross sectional view of general MTJ, respectively.
Figure 2B:
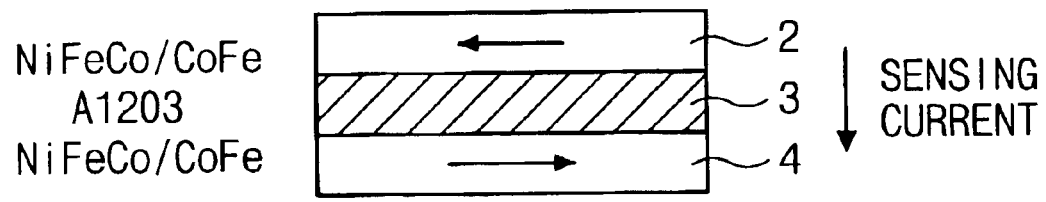
Figure 3A:
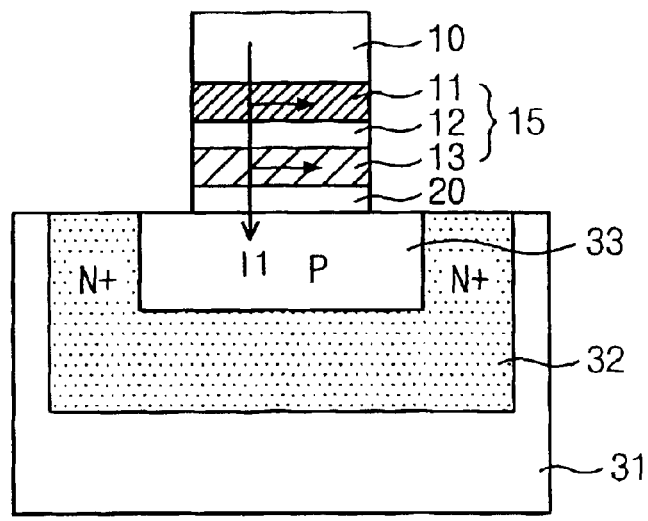
FIGS. 3a and 3b illustrate cross-sectional view of MRAM cell in accordance with the present invention, respectively.
Figure 3B:
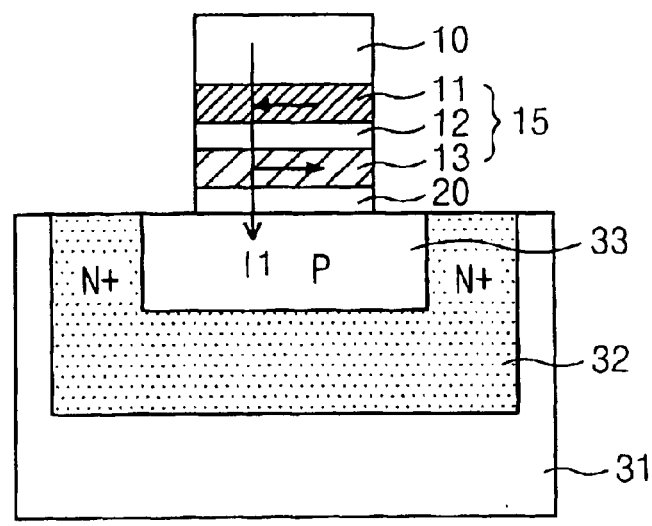

A MRAM of FIGS. 3a and 3b comprises an MTJ 15 deposited on the top portion of a P-type impurity region 33 of a P-N diode device.

A MRAM of the present invention includes an N+ region 32 doped on a semiconductor substrate 31 and a P-N diode comprising a P-type impurity region 33 doped on the line of the N+ region 32. A barrier conductive layer 20 is deposited on the top portion of the P-type impurity region 33. An MTJ is then deposited on the top portion of the barrier conductive layer 20, the MTJ comprising a free ferromagnetic layer 11, a tunnel junction layer 12 and a fixed ferromagnetic layer 13. A word line 10 is formed on the top portion of the MTJ 15.

Figure 4A:
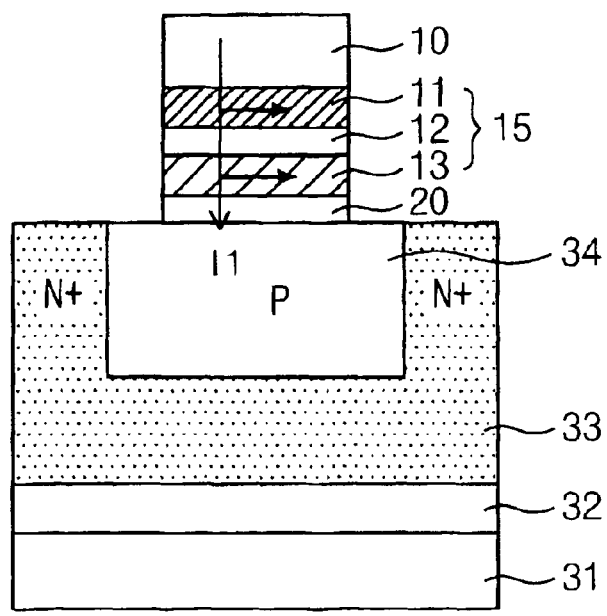
FIGS. 4a and 4b illustrates cross-sectional view of an MRAM cell in accordance with another preferred embodiment of the present invention.
Figure 4B:
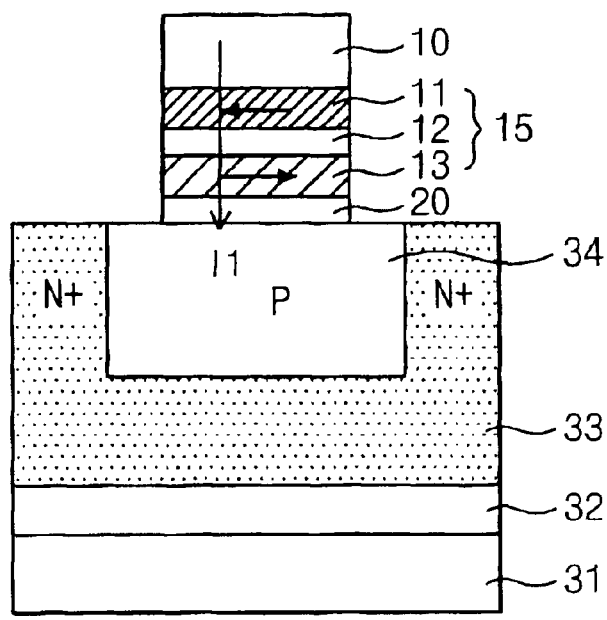

FIGS. 4a and 4b are cross-sectional diagrams of an MRAM cell in accordance with another preferred embodiment of the present invention.

A MRAM of the present invention include an oxide film 32 and a P-N diode. The oxide film 32 is deposited on a semiconductor substrate 31. The P-N diode comprises an N-type polysilicon 33 deposited on the oxide film 32 and a P-type impurity region 34 doped on the line of the N-type polysilicon 33. A barrier conductive layer 20 is then deposited on the top portion of the P-type impurity region 34. An MTJ 15 is deposited on the top portion of the barrier conductive layer 20, the MTJ 15 comprising a free ferromagnetic layer 11, a tunnel junction layer 12 and a fixed ferromagnetic layer 13. A word line 10 is formed on the top portion of the MTJ 15.

Next, the operation process of an MRAM cell having the above-described structure will be explained.

Data having logic values of "1" or "0" is stored in an MRAM cell by orienting the magnetization of a free ferromagnetic layer 15 of an MTJ 15. FIGS. 3a and 4a are examples of the magnetization orientation when a logic value of "1" is stored, while FIGS. 3b and 4b are examples of the magnetization orientation when a logic value of "0" is stored.

The write operation of an MRAM is performed by supplying a predetermined voltage for generating a write current via a word line 10, when a predetermined trigger voltage is applied to a P-N diode. Here, magnetization orientation of a free ferromagnetic layer 11 of an MTJ 15 is determined according to the level of a voltage applied to the word line 10. As a result, logic values of "1" or "0" are written at an MRAM cell according to the amount of a current supplied to the word line 10.

The read operation of an MRAM cell is performed by sensing the amount of a current regulated by magnetization orientation of a free ferromagnetic layer 11 of an MTJ 15. The magnetization orientation of an MTJ 15 is changed by the amount of current I1 flowing between a word line 10 and a P-N diode. Thereby, the amount of a current sensed in an MRAM cell is changed. In other words, a tunneling current I1 flows into an MTJ 15 when a predetermined trigger voltage is applied to a word line 10 and a predetermined sensing voltage is applied to a P-N diode. Here, a sensing current increases when magnetization orientations of a free ferromagnetic layer 11 and a fixed ferromagnetic layer 13 are parallel. On the contrary, a sensing current decreases when magnetization orientations of a free ferromagnetic layer 11 and a fixed ferromagnetic layer 13 are anti-parallel. Accordingly, the magnetization orientation of a free ferromagnetic layer 11 may be detected by sensing the amount of currents flowing into an MRAM cell, and then information stored in an MRAM cell is sensed.

Figure 5:
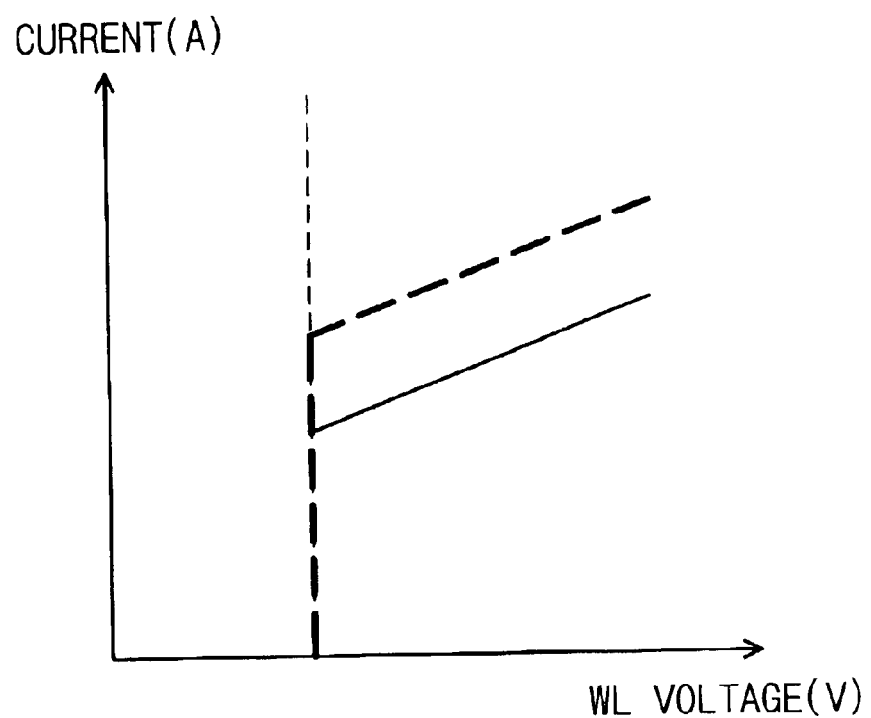
FIG. 5 illustrates a graph of the characteristics of voltage versus current of an MRAM cell in accordance with the present invention.

FIG. 5 is a graph illustrating the change condition of a current according to a voltage of a word line WL.

A logic value of "1" is stored at the MRAM cell if a current of an MTJ 15 increases when a predetermined trigger voltage is applied to a word line 10. When a current of an MRJ 15 decreases, a logic value of "0" is stored at the MRAM cell. In other words, the magnetization orientation of an MTJ 15 is determined by the amount of a current I1 flowing into an MTJ 15, and then data is written at an MRAM cell. Data to be stored in a bit line may be transmitted according to the amount of the sensed current.

Accordingly, a MRAM comprises an MRAM cell including an MTJ between a word line 10 and a P-N diode, wherein data is read/written at the MRAM cell by regulating a current flowing into the MTJ.

Figure 6:
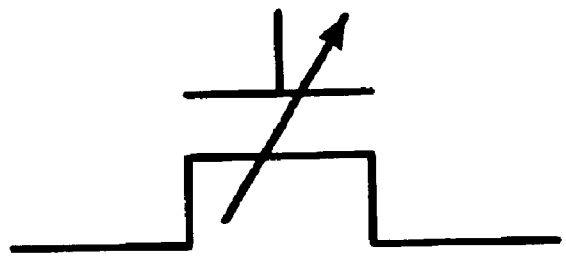
FIG. 6 illustrates an example of a symbol of an MRAM cell in accordance with the present invention.

FIG. 6 shows a symbol of an MRAM cell in accordance with the present invention. Hereinafter, an MRAM cell is now represented by the symbol in FIG. 6.

The structure of an MRAM cell array in a magnetoresistive RAM described above will be explained.

Figure 7:
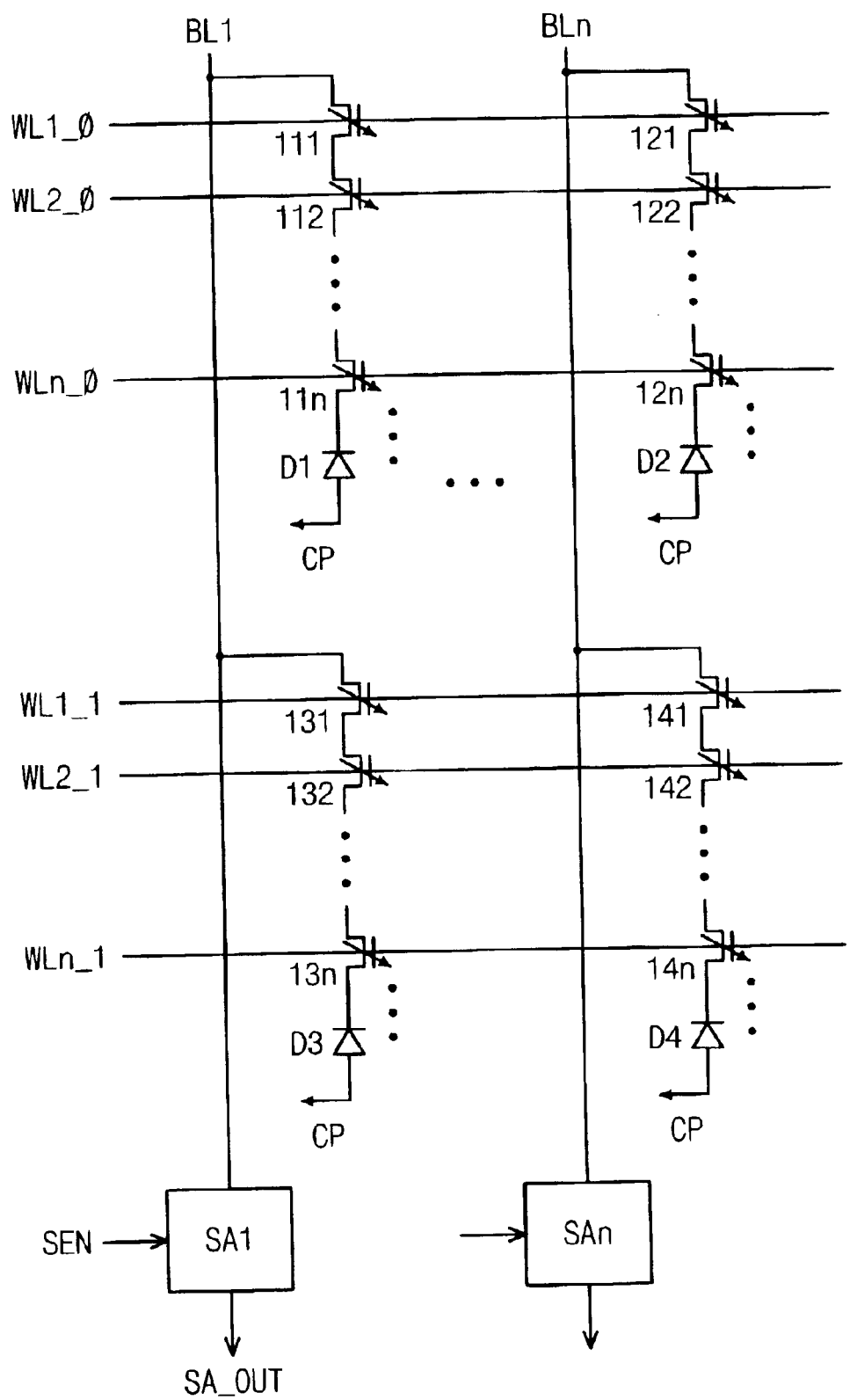
FIG. 7 illustrates a circuit diagram of an MRAM cell array in accordance with a first preferred embodiment of the present invention.

FIG. 7 is a circuit diagram of an MRAM cell array in accordance with a first preferred embodiment of the present invention.

An MRAM cell array of FIG. 7 includes a plurality of word lines WL1_0~WLn_0, WL1_1~WLn_1 and a plurality of bit lines BL1~BLn. The MRAM cell array also includes a plurality of sense amplifiers SA1~SAn connected to a plurality of bit lines BL1~BLn. The plurality of sense amplifiers SA1~SAn output a data signal SA_OUT amplified by an input of a sense amplifier enable signal SEN.

Here, an MRAM cell array includes n MRAM cells. The n MRAM cells have each source and drain connected in series. One terminal of the n MRAM cells connected in series is connected to bit lines BL1~BLn, respectively. The other terminal of the n MRAM cells is connected to a cell plate CP. This structure is called as an MRAM cell group connected in series in a form of an NAND. MRAM cells 111, 121, 131 and 141 in n MRAM cell groups have each drain connected to bit lines, respectively. MRAM cells 11n, 12n, 13n and 14n have each source connected through diodes D1, D2, D3 and D4 to cell plates, respectively.

A plurality of MRAM cell groups are connected to one of bit lines BL. MRAM cells have each gate connected to word lines WL1_0~WLn_0, WL1_1~WLn_1. Word lines WL1_0~WLn_0 are connected in common to MRAM cells 111~11n and 121~12n. The MRAM cells 111~11n in one of MRAM cell groups are coupled with one of bit lines while the MRAM cells 121~12n in the other of MRAM cell groups with the other of bit lines. In this way, word lines WL1_0~WLn_0 are also connected in common to MRAM cells 131~13n and 141~14n. The MRAM cells 131~13n in one of MRAM cell groups are coupled with one of bit lines while the MRAM cells 141~14n in the other of MRAM cell groups with the other of bit lines. Here, diodes D1, D2, D3 and D4 are connected between each of MRAM cell groups and cell plates.

Figure 8:
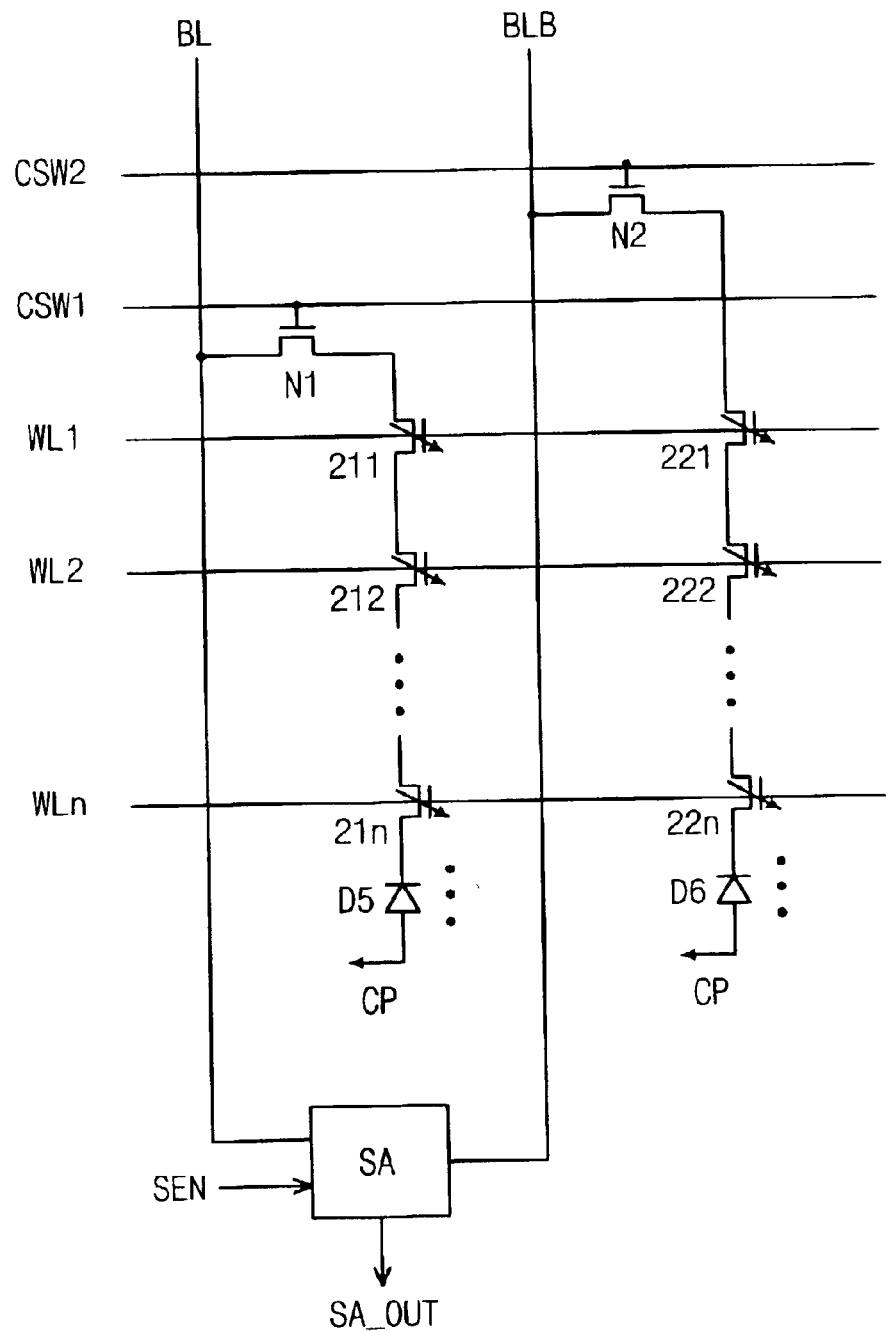
FIG. 8 illustrates a circuit diagram of an MRAM cell array in accordance with a second preferred embodiment of the present invention.

FIG. 8 illustrates an MRAM cell array in accordance with a second preferred embodiment of the present invention.

An MRAM cell array of FIG. 8 includes a plurality of word lines WL1~WLn, a plurality of bit lines BL and a plurality of bit line bars corresponding to the bit lines. The MRAM cell array also includes a sense amplifier connected in common to bit line BL and bit line bar BLB.

MRAM cells 211~21n and 221~22n have each source and drain connected in series in forms of an NAND. A switching transistor N1 has one terminal connected to a bit line, and a switching transistor N2 has one terminal connected to a bit line bar BLB. The MRAM cells 211~21n are connected between the other terminal of the switching transistor N1 and a cell plate CP. A diode D5 is formed between a source of an MRAM cell 21n and a cell plate CP. In this way, the MRAM cells 221~22n are connected between the other terminal of the switching transistor N2 and a cell plate CP. A diode D6 is formed between a source of an MRAM cell 22n and a cell plate CP.

The switching transistor N1 has its gate applied to a switching control signal CSW1 while the switching transistor N2 has its gate applied to a switching control signal CSW2. Word lines WL1~WLn are connected in common to gates of the MRAM cells connected to a bit line BL and a bit line bar BLB.

Figure 9:
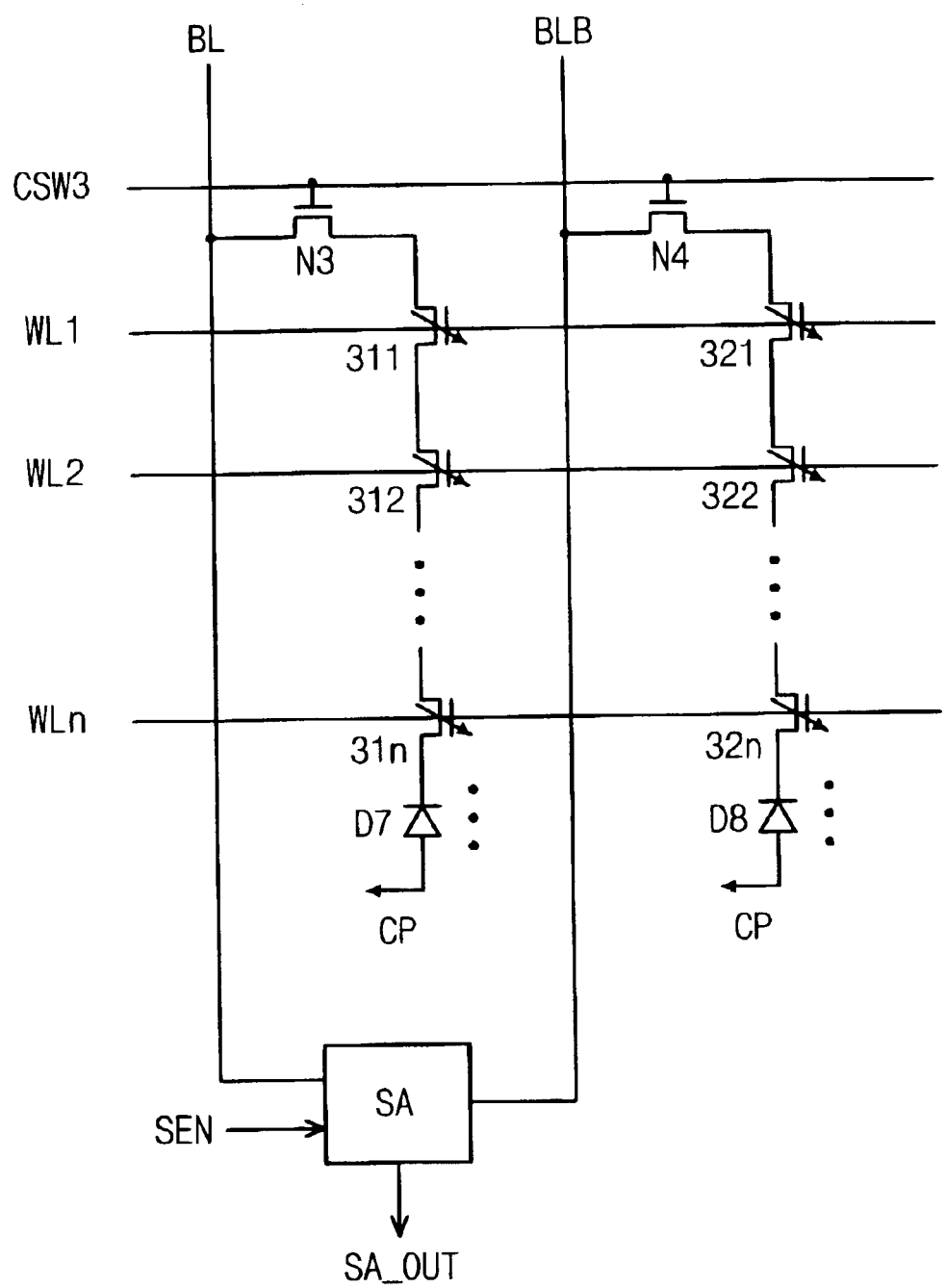
FIG. 9 illustrates a circuit diagram of an MRAM cell array in accordance with a third preferred embodiment of the present invention.

FIG. 9 illustrates an MRAM cell array in accordance with a third preferred embodiment of the present invention.

An MRAM cell array of FIG. 9 includes a plurality of word lines WL1~WLn, a plurality of bit lines BL and a plurality of bit line bars BLB corresponding to the bit lines. The MRAM cell array also comprises a sense amplifier SA connected in common to a bit line BL and a bit line bar BLB.

MRAM cells 311~31n and 321~32n have each source and drain connected in series in forms of an NAND. A switching transistor N3 has one terminal connected to a bit line BL, while a switching transistor N4 has one terminal connected to a bit line bar BLB. The MRAM cells 311~31n are connected between the other terminal of the switching transistor N3 and a cell plate CP. A diode D7 is formed between a source of an MRAM cell 31n and a cell plate CP. In this way, the MRAM cells 321~32n are connected between the other terminal of the switching transistor N6 and a cell plate CP. A diode D8 is formed between a source of an MRAM cell 32n and a cell plate CP. The switching transistors N3 and N4 have each gate applied to a switching control signal CSW3. Word lines WL1~WLn are connected in common to gates of the MRAM cells connected to a bit line BL and a bit line bar BLB.

Figure 10:
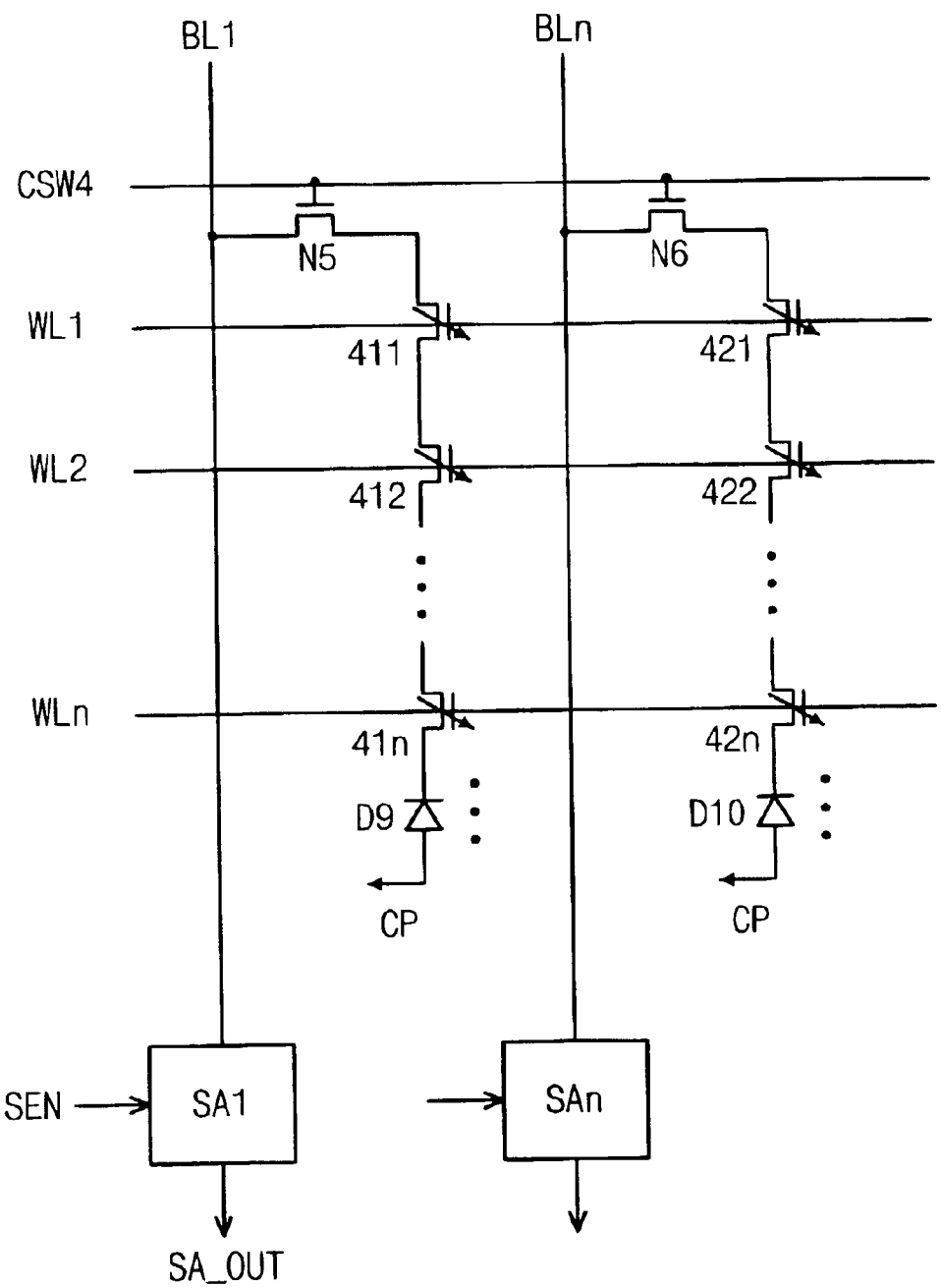
FIG. 10 illustrates a circuit diagram of an MRAM cell array in accordance with a fourth preferred embodiment of the present invention.

FIG. 10 illustrates an MRAM cell array in accordance with a fourth preferred embodiment of the present invention.

An MRAM cell array of FIG. 10 include a plurality of word lines WL1~WLn, a plurality of bit lines BL1~BLn. The MRAM cell array also includes a plurality of sense amplifiers SA1~SAn connected to bit lines BL1~BLn.

MRAM cells 411~41n and 421~42n have each source and drain connected in series in forms of an NAND. A switching transistor N5 has one terminal connected to a bit line BL, while a switching transistor N6 has one terminal connected to a bit line bar BLn. The MRAM cells 411~41n are connected between the other terminal of the switching transistor N5 and a cell plate CP. A diode D9 is formed between a source of an MRAM cell 41n and a cell plate CP. In this way, the MRAM cells 421~42n are connected between the other terminal of the switching transistor N6 and a cell plate CP. A diode D10 is formed between a source of an MRAM cell 42n and a cell plate CP.

A switching control signal CSW4 is respectively applied to each gate of switching transistors N5 and N6. Word lines WL1~WLn have each gate connected to bit lines BL1~BLn, respectively.

Figure 11:
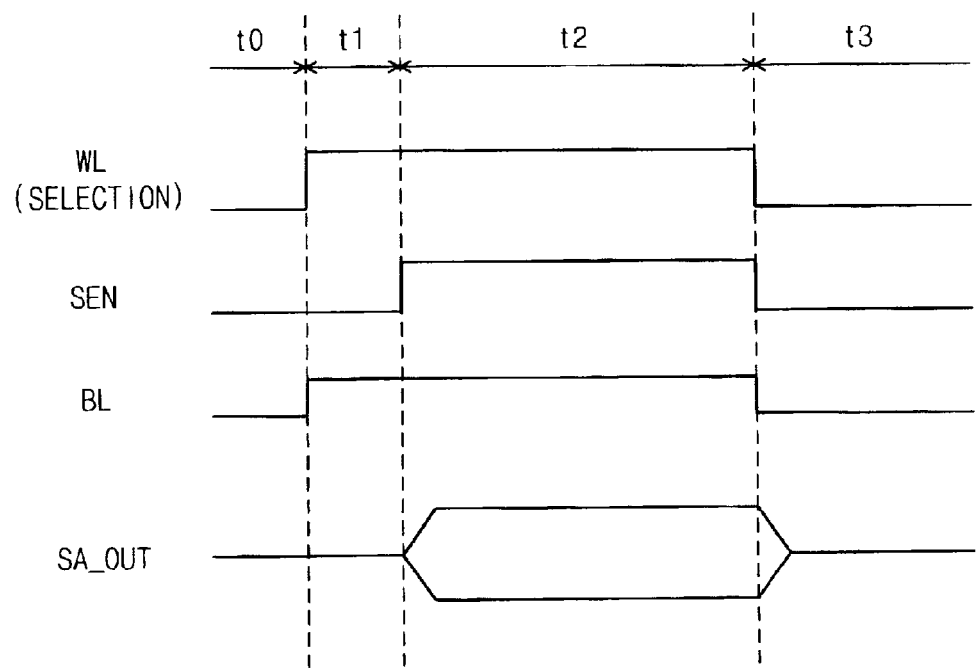
FIG. 11 illustrates a timing diagram during the read operation of an MRAM cell array in accordance with the present invention.
Figure 12:
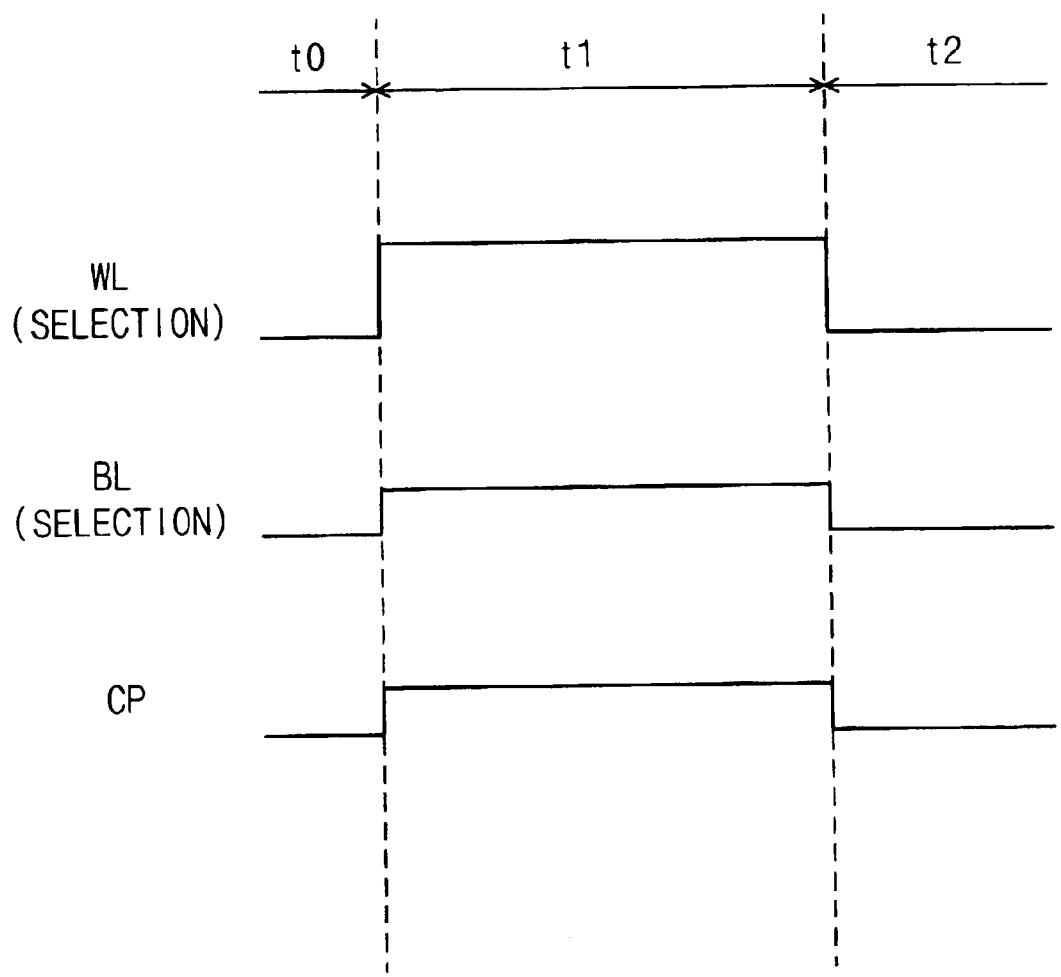
FIG. 12 illustrates a timing diagram during the write operation of an MRAM cell array in accordance with the present invention.

The above-described preferred embodiments in accordance with the present invention perform read/write operations as shown in FIGS. 11 and 12. Here, read/write operations are now explained, based on the operation of the first preferred embodiment. However, read/write operations of the second through fourth embodiments will not be explained because a signal applied to a switching control signal CWS is obvious to a person having an ordinary skill in the art.

As shown in FIG. 11, the read operation is divided into an initial section t0, a memory cell selecting section t1, a sense amplifier enable section t2 and a read terminating section t3.

In the initial section t0, bit lines and word lines maintain low level voltage not to read/write data, and a sense amplifier is disabled.

In the memory cell selecting section t1, a word line WL and a bit line BL are selected to read data stored in an MRAM cell, the word line and the bit line connected to an MRAM cell corresponding to an address wherein data is stored. Here, a predetermined trigger voltage is applied to a selected word line while a ground voltage is applied to a non-selected word line. A predetermined sensing voltage is then applied through a cell plate CP to a selected bit line. Data in an MRAM cell corresponding to a memory cell selected by a sense amplifier SA connected to a bit line BL is outputted. As described in FIGS. 3a and 3b, a predetermined trigger voltage is applied through a word line WL, and then the amount of a sensing current is determined according to magnetization orientation of an MTJ 15. As a result, a large current is outputted into a bit line BL corresponding to an MRAM cell when a logic value of "0" is sensed. On the contrary, when a logic value of "1" is sensed, a small current is outputted into a bit line BL corresponding to an MRAM cell.

In this way, a current corresponding to data stored in an MRAM cell is outputted into a bit line BL. When a current enough to sense is outputted to a bit line BL, a sense amplifier enable section t2 is entered. In the sense amplifier enable section t2, when a sense amplifier enable signal SEN having a predetermined level is applied to a sense amplifier SA, the sense amplifier SA senses a signal transmitted in a bit line and then outputs sensed data SA_OUT into read data. In other words, if a large current is supplied to a bit line BL, a sense amplifier SA senses data into a logic value of "1"

while if a small current is supplied to a bit line BL, a sense amplifier SA senses data into a logic value of "0".

Thereafter, a sense amplifier enable signal is applied to a sense amplifier SA, the sense amplifier enable which is a trigger signal having a predetermined output time. After the predetermined output time elapses, a read terminating section t3 is entered. In the read terminating section t3, states of signals for selecting a word line and a bit line, and of a signal SEN for enabling a sense amplifier return to those of the initial section t0. As a result, a current corresponding to data stored in an MRAM cell does not flow, and then a sensed data SA_OUT is not outputted. Here, data contrary to data stored in a bit line is stored in an MRAM cell connected to a bit line bar BLB, in the second and third preferred embodiments. A current contrary to logic data stored in a bit line BL is outputted into a bit line bar BLB. The corresponding sense amplifier SA then senses data, based on a current outputted from the bit line bar BLB.

Referring to FIG. 12, the write operation in an MRAM cell array will be explained.

The write operation is divided into an initial section t0, a memory cell selecting section t1 and a write terminating section t2.

In the initial section t0, a ground voltage is simultaneously applied to a selected word line WL and a non-selected word line WL. When a write section t1 is entered, a large voltage and a large current is applied to the selected word line WL to sense a predetermined write current.

In the write section t1, a trigger voltage is applied to a selected word line. A small voltage is then applied to a cell plate CP and a bit line BL to generate a predetermined current. As a result, magnetization orientation of a free ferromagnetic layer 11 in an MTJ 15 is determined according to the amount of a current I1 in an MTJ 15. Data having logic values of "0" or "1" is then stored in an MRAM cell. On the contrary, magnetization orientation of a free ferromagnetic layer 11 in an MRAM is differently regulated by adjusting the amount of a current between a cell plate CP and a bit line BL. As a result, two or more data can be stored.

Accordingly, time for storing data in an MRAM cell is secured by a write section t1. In a write terminating section t2, a ground voltage is then applied to a word line. Here, data contrary to data stored in a bit line BL is stored in an MRAM cell connected to a bit line bar BLB, in second and third preferred embodiments.

As described earlier, in the present invention, an MRAM cell can be structured simply. AS a result, the structure of an MRAM cell array can be improved, thereby resulting in improved process.

In addition, the present invention has effects to reduce an MRAM cell size and improve a sensing margin.

What is claimed is:

1. A magnetic random access memory, comprising:
    a P-N diode having an N+ region doped on a semiconductor substrate and a P-type impurity region doped on the line of the N+ region;
    a barrier conductive layer deposited on the top portion of the P-type impurity region;
    an MTJ deposited on the top portion of the barrier conductive layer; and
    an MRAM cell having an MTJ between the barrier conductive layer and a word line, wherein the word line is deposited on the top portion of the MTJ;
    wherein data is read/written at the MRAM cell by regulating a current flowing through the MTJ according to voltage applied to the word line.

2. A magnetic random access memory, comprising:
    an oxide film deposited on a semiconductor substrate;
    a P-N diode having an N-type polysilicon deposited on the oxide film and a P-type impurity region doped on the line of the N-type polysilicon;
    a barrier conductive layer deposited on the top portion of the P-type impurity region;
    an MTJ deposited on the top portion of the barrier conductive layer; and
    an MRAM cell having an MTJ between the barrier conductive layer and a word line, wherein the word line is deposited on the top portion of the MTJ;
    wherein data is read/written at the MRAM cell by regulating a current flowing through the MTJ according to voltages applied to the word line.

3. A magnetic random access memory comprised of a plurality of word lines, a plurality of bit lines and a plurality of MRAM cell groups;
    wherein the MRAM cell groups are located at one side of a bit line, and includes a plurality of MRAM cells having each gate connected to different word lines, respectively; and
    wherein the plurality of MRAM cells have each drain and source connected in series in a form of an NAND, the one terminal of the MRAM cell group is connected to one of the bit lines, and the other terminal is connected through a diode to a cell plate.

4. The magnetic random access memory according to claim 3, wherein one of the bit lines is connected to one or more MRAM cell groups.

5. The magnetic random access memory according to claim 3, further comprising a switching means for selectively connecting the MRAM cell group to a plurality of bit lines in accordance with a switching control signal.

6. The magnetic random access memory according to claim 5, wherein the switching means comprises:
    a first switching device connected between a first bit line and a first MRAM cell group, and to which the switching signal is applied through a gate; and
    a second switching device connected between a second bit line and a second MRAM cell group, and to which the switching signal is applied through a gate.

7. The magnetic random access memory according to claim 3, further comprising a switching means for selectively connecting the MRAM cell group to the bit line and a bit line bar in accordance with a switching control signal.

8. The magnetic random access memory according to claim 7, wherein the switching means comprises:
    a third switching device connected between a bit line and a third MRAM cell group, and to which the switching control signal is applied through a gate; and
    a fourth switching device connected between a bit line bar and a fourth MRAM cell group, and to which the switching control signal is applied through a gate.

9. The magnetic random access memory according to claim 7, wherein the bit line and the bit line bar share a sense amplifier.

10. The magnetic random access memory according to claim 3, further comprising:
    a first switching means for selectively connecting a fifth MRAM cell group to the bit line in accordance with a first switching control signal; and
    a second switching means for selectively connecting a sixth MRAM cell group to a bit line bar in accordance with a second switching control signal.

11. The magnetic random access memory according to claim 10, wherein the first switching means includes a fifth switching device connected between the bit line and a fifth MRAM cell group and to which the first switching control signal is applied through a gate.

12. The magnetic random access memory according to claim 10, wherein the second switching means includes a sixth switching device connected the bit line bar and a sixth MRAM cell group and to which the second switching control signal is applied through a gate.

13. The magnetic random access memory according to claim 10, wherein the bit line and the bit line bar share a sense amplifier.

14. The magnetic random access memory according to claim 3, wherein the MRAM cell comprises:

- a P-N diode having an N+ region doped on a semiconductor substrate and a P-type impurity region doped on the line of the N+ region;
- a barrier conductive layer deposited on the top portion of the P-type impurity region; and
- an MTJ formed between the barrier conductive layer and a word line,
- wherein data is read/written at the MRAM cell by regulating a current flowing through the MTJ in accordance with a voltage applied to the word line.

15. The magnetic random access memory according to claim 3, wherein the MRAM cell comprises:

- an oxide film deposited on a semiconductor substrate;
- a P-N diode having an N-type polysilicon stacked on the oxide film and a P-type impurity region doped on the line of the N-type polysilicon;
- a barrier conductive layer deposited on the top portion of the P-type impurity region; and
- an MTJ formed between the barrier conductive layer and a word line,
- wherein data is read/written at the MRAM cell by regulating a current flowing through the MTJ in accordance with voltage applied to the word line.

* * * * *